United States Patent [19]

Groeger et al.

[11] 4,014,008

[45] Mar. 22, 1977

[54] CIRCUIT ARRANGEMENT FOR INTERFERENCE-FREE STORAGE OF INFORMATION IN A PROGRAMMABLE READ-ONLY MEMORY

[75] Inventors: Ingo Groeger; Juergen Scharbert, both of Munich, Germany

[73] Assignee: Siemens Aktiengesellschaft, Berlin & Munich, Germany

[22] Filed: Jan. 23, 1976

[21] Appl. No.: 651,915

[30] Foreign Application Priority Data

Feb. 7, 1975 Germany .......................... 2505300

[52] U.S. Cl. ...................... 340/173 R; 340/173 SP
[51] Int. Cl.² .................. G11C 11/40; G11C 17/00
[58] Field of Search .................. 340/173 R, 173 SP; 307/238

[56] References Cited
UNITED STATES PATENTS 3,739,355 6/1973 Radcliffe ...................... 340/173 R Primary Examiner—Terrell W. Fears
Attorney, Agent, or Firm—Hill, Gross, Simpson, Van Santen, Steadman, Chiara & Simpson

[57] ABSTRACT

A circuit arrangement for interference-free storage of information in a programmable read only memory in which the storage elements comprise a circuit element and an interruptable resistor arranged between intersecting row lines and column lines and in which information of one type is stored in a storage element by interrupting the resistor with a flow of a predetermined current therethrough which is large when compared to current flow during a reading operation, employs a regulating transistor per column line whose emitter is connected to the assigned column line, whose collector is connected to an operating voltage, and whose base is connected to a reference voltage. The value of the base reference voltage is selected such that the regulating transistor is rendered conductive only if the voltage on the column line drops below a predetermined value during the interruption of the resistor of a storage element.

3 Claims, 11 Drawing Figures

CIRCUIT ARRANGEMENT FOR INTERFERENCE-FREE STORAGE OF INFORMATION IN A PROGRAMMABLE READ-ONLY MEMORY

BACKGROUND OF THE INVENTION

1. Field of the Invention

This invention relates to a circuit arrangement for interference-free storage of information in a programmable read only memory of the type in which storage elements consists of a circuit element and an interruptable resistor arranged between intersecting row lines and column lines, and in which information of one type is stored in a storage element by interrupting the resistor thereof with a predetermined current which is large compared with the current flowing during a reading operation.

2. Description of the Prior Art

In programmable read only memories, for example, in ECL technology, storage elements are arranged in matrix form between row lines and column lines. The storage elements comprise a circuit element and an interruptable resistor, herein called the memory resistor. The circuit element may be, for example, a transistor or a diode. The memory resistor comprises, for example, NiCr. (Mo, Gilbert: Reliability of NiCr "Fusible Links" used in PROM'S, Journal of Electronic Society, 120 (1973) Pages 1001–1003). If information is to be stored in the programmable read only memory, the memory resistors must be interrupted, or remain uninterrupted, corresponding to the information which is to be stored. For example, a binary "1" corresponds to an interrupted resistor; whereas, a binary "$\phi$" corresponds to an interrupted resistor. Interruption of the resistors takes place by sending a correspondingly large current therethrough. This is made possible by applying a correspondingly large voltage to the storage elements, and effecting a through connection of the circuit elements.

If, for example, the circuit elements consist of transistors, and if the memory resistor is located in the emitter path of this transistor, the interrupting current is obtained by applying a voltage to the base of the transistor, which voltage is of such a type that a current necessary in order to interrupt the memory resistor can flow via the collector-emitter path.

However, the resistance value of the memory resistor thereby constantly increases, and the voltage drop over the memory resistor steadily increases. The consequence is that the voltage on the column line connected to the memory resistor steadily increases in magnitude. However, there is then the risk that the unselected row lines and column lines are influenced by way of the inactive storage elements. This means that the inactive storage elements are likewise gradually rendered conductive and a portion of the current necessary to interrupt a memory resistor bypasses and flows through the unselected storage elements.

SUMMARY OF THE INVENTION

The object of the present invention, therefore, is to provide a circuit arrangement in which the storage of information in a programmable read only memory takes place without being affected by unselected column lines and row lines.

The above object is achieved in a circuit arrangement of the type mentioned above by providing one regulating transistor per column line, whose emitter is connected to the assigned column line, whose collector is connected to an operating voltage, and whose base is connected to a reference voltage, and by selecting the reference voltage in such a way that the regulating transistor is rendered conductive only if the voltage on the column line during interruption of the memory resistor falls below a predetermined value.

The reference voltage is expediently selected such that it is more positive than or equal to the voltage on the unselected row lines.

If the read amplifiers are also connected to the column lines by way of read transistors, it is advantageous to select the reference voltage of the regulating transistors to be more positive than the control voltage applied to the base of the read transistor. Therefore, it is achieved that the voltage on the column line which varies during the interruption of a memory resistor does not render the read transistors conductive.

BRIEF DESCRIPTION OF THE DRAWINGS

Other objects, features and advantages of the invention, its organization, construction and operation will be best understood from the following detailed description, taken in conjunction with the accompanying drawings, on which.

DESCRIPTION OF THE PREFERRED EMBODIMENT

Figure 1:
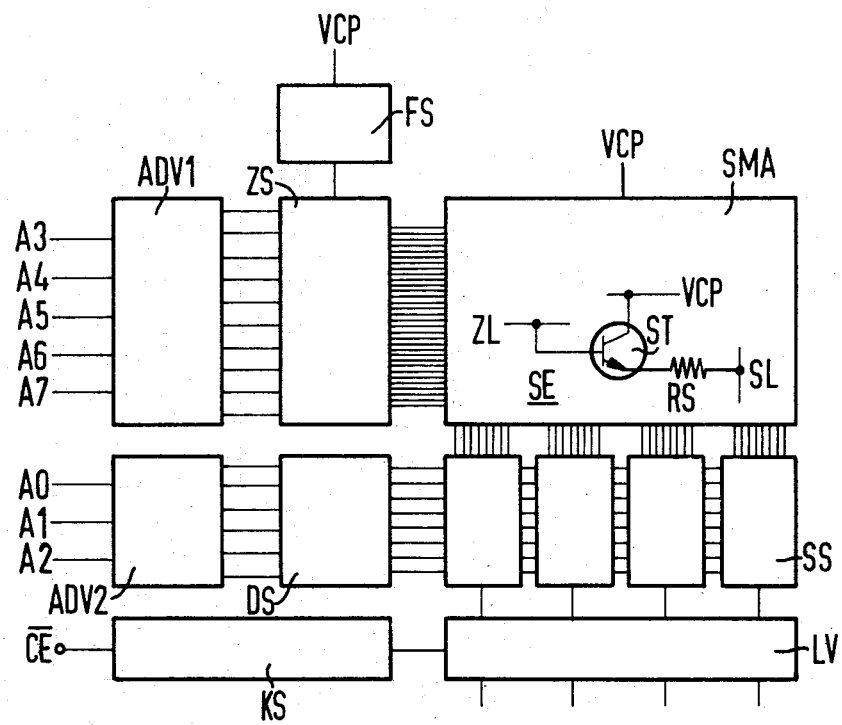
FIG. 1 is a block diagram illustration of a programmable ECL read only memory.

In FIG. 1, an ECL storage matrix SMA is illustrated as comprising storage elements SE arranged between intersecting row lines ZL and column lines SL. The storage elements SE are, in each case, arranged at the points of intersection between the row lines ZL and the column lines SL, although only one such element is specifically illustrated. In an exemplary embodiment of the invention, the storage elements each comprise a transistor ST, hereinafter called a memory transistor, and a memory resistor RS which is connected in the emitter circuit of the memory transistor ST. The memory resistor RS is a NiCr resistor.

Address signals A0 through A7 are supplied to the read only memory for the purpose of selecting row lines and/or column lines. The address signals for the row lines are amplified in an address amplifier ADV1. The amplified address signals are then delivered to a plurality of row switches ZS. In the latter, the address signals are also decoded. Correspondingly, the address signals for the column lines SL are amplified in an address amplifier ADV2, and then fed to a decoder circuit DS. Four column circuit groups SS are connected to the decoder circuit DS. The storage matrix, in particular, is constructed in such a way that, in each case, a specific number of column lines are combined into a bank. A plurality of read amplifiers LV are also connected to the column lines, whereby a read amplifier is assigned to each bank of column lines. The amplified read output signals then appear at the output of the read amplifiers LV. An additional signal $\overline{CE}$ is fed to the storage module by means of which the module is selected. The signal $\overline{CE}$ is supplied to the read amplifiers by way of a preparation circuit KS. Finally, an additional circuit arrangement FS is provided by means of which a corresponding voltage is applied to the selected row line during the programming of the storage matrix. This circuit arrangement is connected or switched in by an operating voltage source VCP which can be switched-selected.

Figure 2:
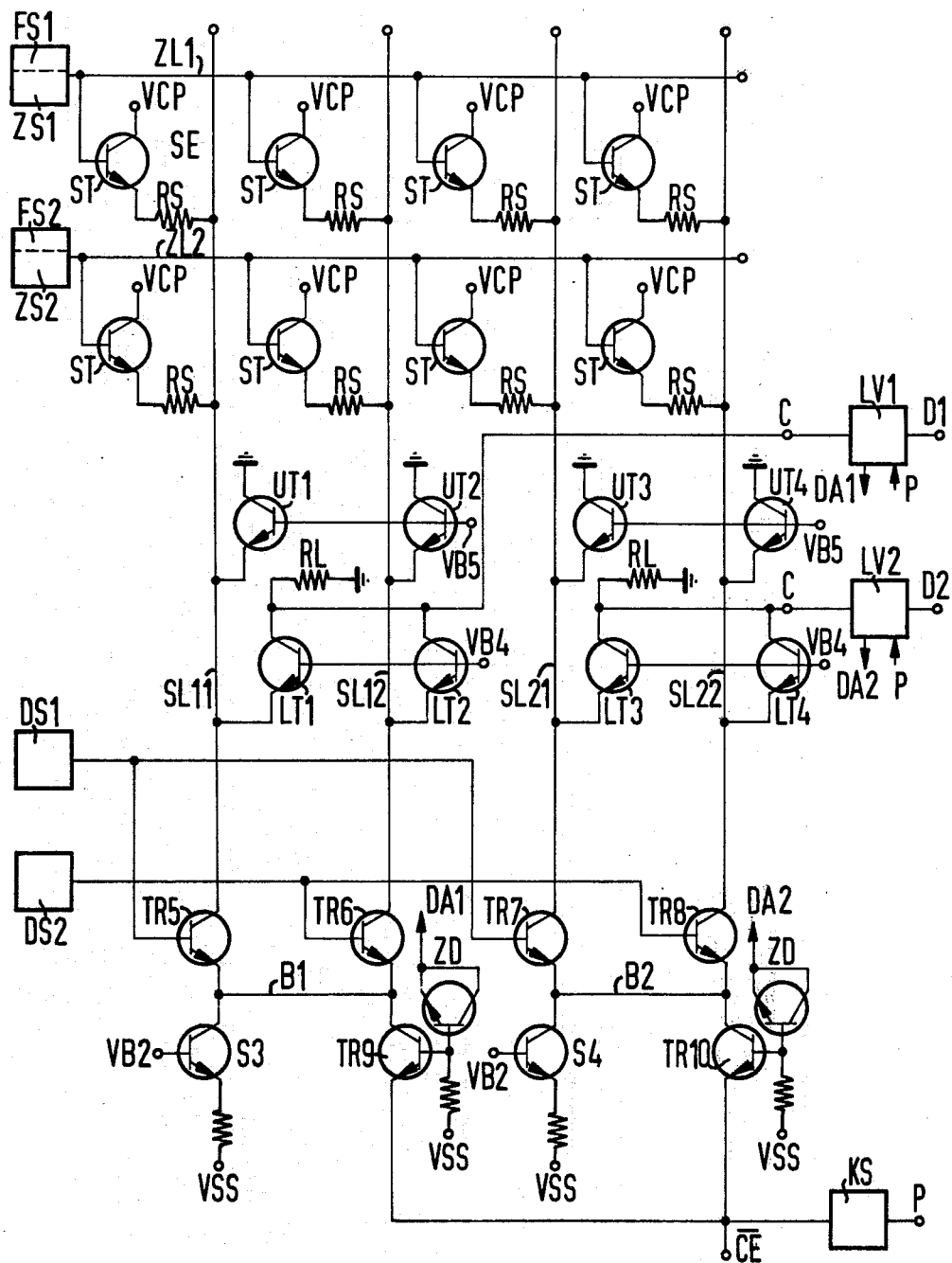
FIG. 2 is a schematic circuit diagram of a programmable read only memory, particularly showing the read transistors and regulating transistors.

A more precise and detailed illustration of an embodiment of a storage matrix having the switching circuits directly connected to the row lines ZL and to the column lines SL is illustrated in FIG. 2. The storage matrix of the programmable ECL storage module in the exemplary embodiment illustrated herein comprises two row lines ZL1 and ZL2, and two banks with two column lines SL11 and SL12, and SL21 and SL22, respectively. The storage elements which are constructed from a memory transistor ST and a memory resistor RS are arranged at the intersections of the row lines ZL and the column lines SL. The base of a memory transistor ST is connected to a row line ZL; whereas, the interruptable memory resistor RS connects the emitter of the memory transistor ST to the appertaining column line SL. The collector of the memory transistor ST is connected to a switch-selected operating voltage source VCP.

The row lines ZL are connected to a row switch ZS and to the circuit arrangement FS, i.e. a row switch ZS1 and a circuit arrangement FS1 are connected to the row line ZL1 and the row switch ZS2 and a circuit arrangement FS2 are connected to the row line ZL2.

The column lines SL are connected to a constant current source S3 or S4, respectively, via respective column switch transistors TR5, TR6, TR7 and TR8, respectively. The column switch transistors TR5, TR6, TR7 and TR8 are further connected to the decoder circuits DS1 and DS2. Two column lines are each integrated into a bank B. For example, the column lines SL11 and SL12 are integrated into a bank B1 and the column lines SL21 and SL22 are integrated into a bank B2. The emitters of the column switch transistors of each bank are connected to each other and, for the bank B1, are connected to the collector of a transistor TR9, and, for the bank B2, are connected to the collector of a transistor TR10, the emitters of the transistors TR9 and TR10 being connected to a modular selection input $\overline{CE}$. The bases of the transistors TR9 and TR10 are controlled with the aid of a resistor and a transistor ZD connected in such a way that it opens upon reaching a specific blocking voltage.

Figure 5:
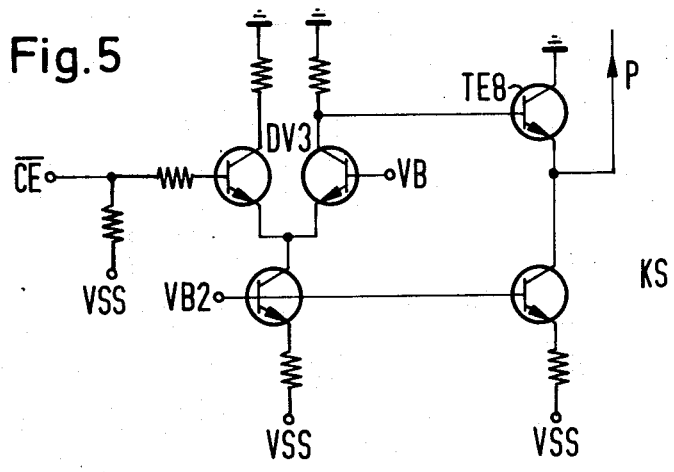
FIG. 5 is a schematic circuit diagram of a circuit arrangement for preparing the read amplifier for operation.

In addition, the read amplifiers LV1 and LV2 are connected to the column lines SL with one read amplifier connected to one bank of column lines in each case. The coupling of a read amplifier LV to a column line SL takes place by way of a read transistor LT. For example, the read amplifier LV1 is connected to the column line S11 by way of a read transistor LT1, and to the column line SL12 by way of a read transistor LT2. Correspondingly, the read amplifier LV2 is connected to the column line SL21 by way of a read transistor LT3, and to the column line SL22 by way of a read transistor LT4. A load resistor RL is connected, in each case, in the collector circuit of the read transistors LT assigned to one bank of the column lines. The bases of the read transistors LT are connected to a reference potential VB4. A selection signal P is supplied to the read amplifiers LV by way of a preparation circuit KS (FIG. 5). In addition, the read amplifier LV1 or LV2 is connected to a respective point DA1 or DA2 of the base of the transistor TR9 or the transistor TR10, respectively. This is necessary in order to be able to control the transistors TR9 and TR10 via the outputs DA1 and DA2 of the read amplifiers LV1 and LV2, respectively, during the storage of information.

The constant current sources S are all constructed alike and in accordance with known techniques and are conductively controlled by a voltage VB2, the voltage VSS being an additional operating voltage.

A regulating transistor UT is provided for each column line SL. The emitter of the regulating transistor UT is connected to a column line SL, while its collector is connected to an operating voltage, for example 0 volt. The base of the regulating transistor UT is connected to a reference potential VB5. The purpose of the regulating transistors is to prevent the voltage on the column lines from becoming too negative during the storage of information in the storage matrix.

An explanation of storing information into a storage element will now be given. For example, attention is directed to the storage element which is the second from the left in the upper row of FIG. 2. First of all, the operating voltage source VCP is switched to a high value, for example, +6 volts. Then, with the aid of the row switch ZS1, the row line ZL1 is selected. A possible construction of a row switch ZS1 is readily apparent from FIG. 3. In the case of a selected row line, the voltage on the row line is, for example, approximately +3.5 volts. This voltage is connected from the circuit arrangement FS to the row line ZL1. Further, the column line SL12 is activated. This takes place via the column switch transistor TR6, which is brought into conduction by the decoder circuit DS2. In addition, however, the transistor TR9 must be rendered conductive. For this purpose, a signal is applied to the input D1 of the read amplifier LV1, which signal reaches the base of the transistor TR9 at the point DA1. This signal is necessary in order to select a bank of column lines, in particular the bank B1 which includes the column lines SL12. Since the row line ZL1 and the column line SL12 are selected, the memory transistor ST of the storage element is rendered conductive. Then, a specific current flows through the memory transistor RS, which has been prepared by the operating voltage source VCP and adjusted at the modular selection input $\overline{CE}$ by an external current source. The resistance value of the memory resistor RS is thereby increased. At the same time, the voltage drop over the resistor RS becomes greater, and, with an increasing resistance of the memory resistor RS, the voltage on the column line SL12 decreases steadily.

A potential of −1.6 volts, for example, is applied to the unselected row lines, here the row line ZL2. If, for example, the voltage on the column line SL12 becomes more negative than that on the unselected row line the danger exists that the memory transistors of the unselected storage elements will pass into the conductive state, i.e. the unselected row lines ZL are influenced in their potential conditions during interruption of the memory resistor.

The regulating transistor UT is provided in order to prevent the above problem. A reference voltage VB5 is connected to the base of the regulating transistor UT, which potential is more positive than or equal to the potential on the unselected row lines. Thus, if the potential on the column line SL12 drops during interruption of the memory resistor RS, the regulating transistor UT2 becomes conductive at a specific voltage determined by the reference potential VB5, and assumes a portion of the current flowing on the column line SL12. Therefore, the possibility of a further drop in voltage on the column line SL12 is prevented. However, the influencing of the storage elements situated between the unselected row lines ZL and the column line SL12 is also prevented in this manner.

Figure 6:
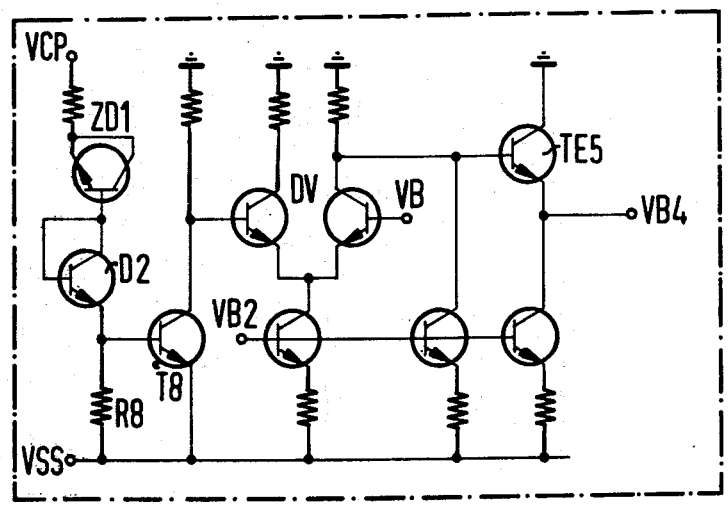
FIG. 6 is a schematic circuit diagram of a circuit arrangement for switching the operating voltage for the read transistors.

If, in addition, the reference potential VB5 is selected to be more positive than the potential VB4 at the bases of the read transistors LT, it is possible to prevent the read transistors LT from assuming a part of the current flow on the column line SL12 during interruption of a memory resistor. For this purpose, the control voltage VB4 is switched more negative if information is to be written into the storage matrix. During the read operation, the control voltage VB4 is again altered, since entirely different potential conditions are then present on the column lines. Switching over the control voltage VB4 takes place with the aid of the operating voltage source VCP, which can be switched selected to different potentials. A corresponding circuit for this purpose is illustrated in FIG. 6.

Figure 3:
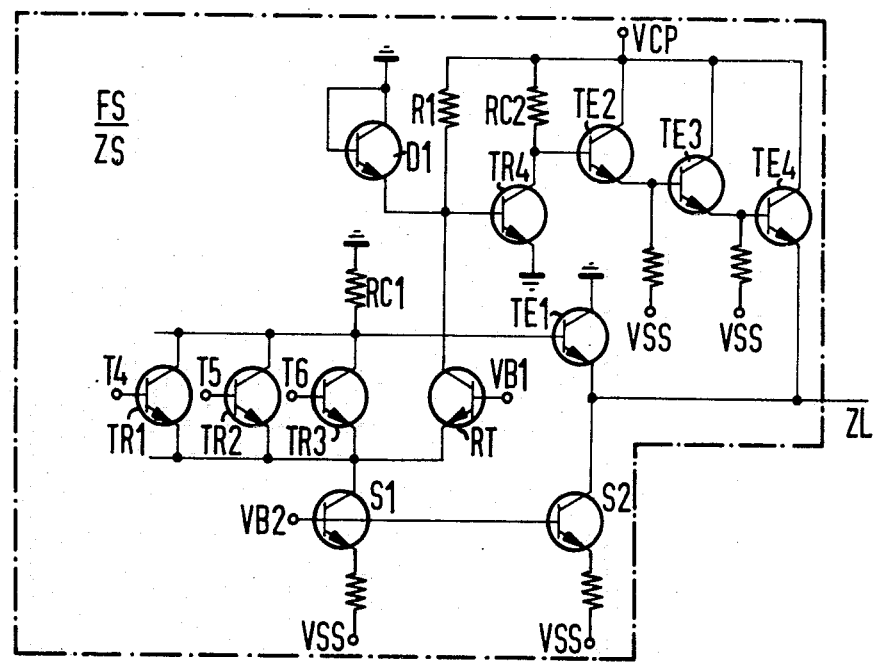
FIG. 3 is a schematic circuit diagram of a row switch, together with a circuit arrangement for applying a corresponding voltage to a selected row line during the storage of information.

FIG. 3 illustrates a row switch and a circuit arrangement FS which aids in providing the voltage necessary on the row line in order to program the storage module. The row switch comprises a differential amplifier and an emitter follower TE1 connected to the differential amplifier. The differential amplifier is constructed from a plurality of transistors TR1, TR2 and TR3 which have their collector-emitter circuits connected in parallel and their bases controlled by address signals, a reference transistor RT, a current source S1 and a collector resistor RC1. The circuit arrangement FS comprises a circuit transistor TR4, a collector resistor RC2, and three emitter follower stages TE2, TE3 and TE4 which are connected in a series chain. The operating voltage source VCP, which can be switched to different potentials, is connected to the collectors of the emitter follower transistors TE2—TE4. Moreover, the operating voltage source VCP is connected to the base of the circuit transistor TR4 by way of a resistor R1, and to the collector of the circuit transistor TR4 by way of a resistor RC2.

If a piece of information, for example a binary "1" is to be stored in the storage matrix, the operating voltage source VCP is switched to a positive voltage, for example +6 volts. The assigned row line ZL is selected if the control transistors TR1, TR2, TR3 of the assigned row switch are all blocked. The reference transistor RT is then conductive and a current can flow from the operating voltage source VCP by way of the resistor R1 and the reference transistor RT. The circuit transistor TR4 is then blocked; in contrast, the emitter follower transistors TE2, TE3 and TE4 are rendered conductive.

A potential of approximately +3.5 volts then is applied to the row line ZL. If, however, the row line ZL is not selected, at least one of the control transistors TR1, TR2, TR3 is in the conductive state and the reference transistor RT is thus blocked. The circuit transistor TR4 is then conductive and the transistors of the emitter follower stages TE2, TE3 and TE4 are in a blocked state. The voltage on the row line ZL is then determined by the emitter follower stage TE1. This potential then amounts to approximately −1.6 volts.

If a read out from the storage matrix is to be performed, the operating voltage source VCP is switched to provide an output of 0 volts. The circuit arrangement FS thereby no longer has any influence on the row line ZL. Rather, only the row switch continues to influence the row line ZL. The selection of a row line ZL takes place in the same manner as has been described above in programming the storage matrix. During the reading operation, a read current flows in the column line which is small as compared with the programming current in a column line.

Figure 4:
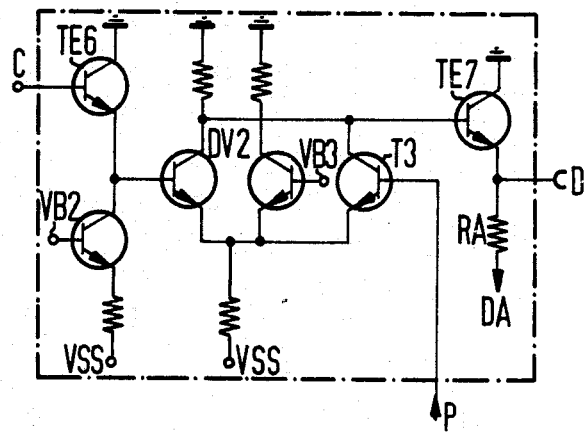
FIG. 4 is a schematic circuit diagram of a read amplifier.

FIG. 4 illustrates how a read amplifier LV can be constructed. It is illustrated that a bank of column lines can be selected from the output D via a point DA. In addition, it is apparent that the collectors of the read transistors LT are connected to a point C. The line at the point P is connected to the circuit arrangement KS for preparing the read amplifier. This circuit arrangement is illustrated in FIG. 5. Here, the selection signal $\overline{CE}$ is supplied. The circuit arrangement converts the selection signal and conveys the same to the read amplifier at the point P. Since the construction of the read amplifier and the preparation circuit KS is not significant in terms of the invention, a detailed explanation of the same will not be given here. The read amplifier comprises an emitter follower TE6, a differential amplifier DV2, and an additional emitter follower TE7. The preparation circuit is constructed from a differential amplifier DV3, and an emitter follower TE8, VB being a reference voltage.

FIG. 6 illustrates how a reference voltage VB4 for the read transistors LT can be produced. This voltage has a different value during storing of information than during the reading of the information. A switch-selected operating voltage source VCP is employed in order to effect the process of potential transfer. The source VCP is connected to a transistor T8 by way of a transistor ZD1, which acts as a Zener diode, and by way of a diode D2, constructed from a transistor. The collector of the transistor T8 is connected to a differential amplifier DV. One output of the differential amplifier DV is connected to an emitter follower TE5. The voltage VB4 is tapped at the emitter of the emitter follower transistor, which voltage can be transferred to 0 volt. Then the control voltage VB4 has a smaller value; however, on the other hand, if the operating voltage source VCP has the value of 6 volts, the voltage VB4 then has a larger value.

The decoder circuits DS can, in principle, be constructed corresponding to the row switch (FIG. 3)

whereby, however, the output potentials of the decoder circuits differ from the output potentials of the row switch.

Figure 7:
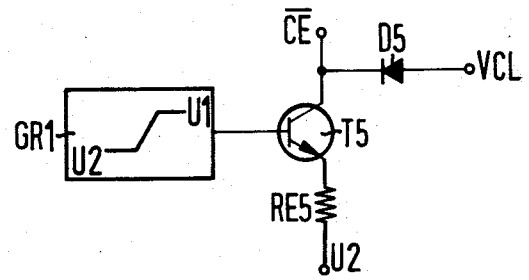
FIG. 7 is a schematic circuit diagram of a switchable circuit arrangement for producing the current necessary in order to interrupt the memory resistors.

FIG. 7 illustrates the switchable circuit arrangement for producing the specified current for interrupting the memory resistors. This circuit arrangement is not arranged on the storage module; therefore, the current is supplied to the storage module from an external point, specifically at the input for the modular selection signal $\overline{CE}$. The circuit arrangement contains a generator GR1, which produces two voltages U1 and U2 having a gradient therebetween as illustrated on the block GR1. The output of the generator GR1 is connected to the base of a circuit transistor T5. The circuit transistor T5 is connected to the voltage U2 by way of a resistor RE5. A diode D5 is connected to the collector which, in addition, is connected to a recovery voltage VCL. The collector of the circuit transistor T5 is connected to the input for the modular selection signal $\overline{CE}$. The diode D5 prevents the collector voltage from dropping too sharply.

Figure 8:
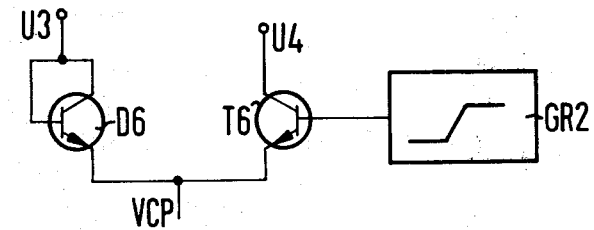
FIG. 8 is a schematic circuit diagram illustrating the provision of a switch-selected operating voltage.

From FIG. 8 it is readily apparent how the operating voltage VCP, which is switched between selected potentials, can be produced from the operating voltages U3 and U4. The circuit comprises a transistor T6, a transistor D6 connected as a diode, and a generator GR2 connected to the base of the transistor T6. The generator GR2 connects two voltages of the type illustrated in the generator to the base of the transistor T6, by means of which the transistor T6 is switched on and off. The operating voltage VCP, which can be switched-selected, is tapped at the emitter of the transistor T6 which is connected to the diode D6. The circuit arrangement according to FIG. 8 is likewise not arranged on the storage module.

Figure 9:
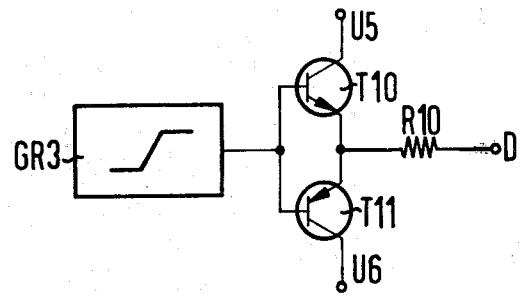
FIG. 9 is a schematic circuit diagram illustrating the provision of a switch-selected voltage.

FIG. 9 illustrates a circuit which is connected to the output B of the read amplifier LV. With the aid of this circuit, the column line bank is selected. This circuit comprises a generator GR3, two complementary transistors T10 and T11 whose bases and whose emitters are connected together, respectively, and a resistor R10 connected between the emitters of the transistors and the terminal D. A voltage U5 is connected to the collector of the transistor T10, and a voltage U6 is connected to the collector of the transistor T11. The generator GR3, at one time, switches on the transistor T10, and at another time, switches on the transistor T11. The circuit illustrated in FIG. 9 is also not arranged on the storage module.

Figure 10:
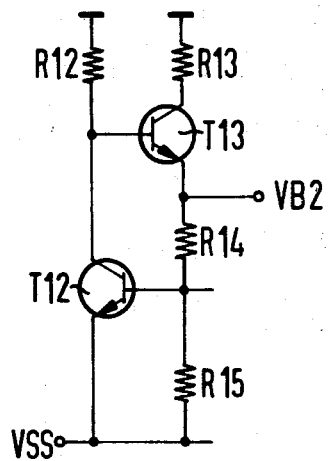
FIG. 10 is a schematic circuit diagram of an arrangement for producing a reference voltage.

FIG. 10 illustrates a circuit arrangement by means of which a reference voltage VB2 can be produced. It comprises a pair of transistors T12 and T13 and a plurality of resistors R12, R13, R14 and R15. This circuit is one of many well known types of supply circuits and a further detailed discussion is not deemed necessary.

Figure 11:
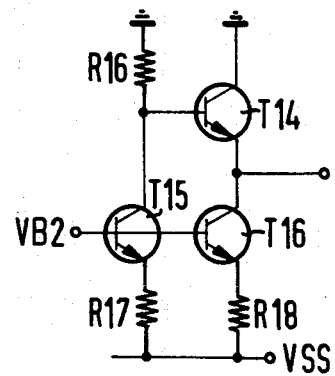
FIG. 11 is a schematic circuit diagram of another circuit arrangement for producing an additional reference voltage.

FIG. 11 illustrates a circuit with which the remaining reference voltages VB, VB1, VB3, VB5 may be obtained. It is also constructed in a known manner and comprises a plurality of transistors T14, T15 and T16 and a plurality of resistors R16, R17 and R18. The reference voltages emitted by this circuit can, of course, vary in magnitude depending upon the dimensioning of the component elements employed.

The invention has been described on the basis of an ECL storage matrix. However, it can also be employed in other programmable read only memories.

The circuit arrangement according to the invention has the advantage that, by introducing a single transistor per column line, the influencing of unselected row lines and column lines, as well as the read transistors, is prevented during the programming of a storage element. An additional advantage is that the power loss in the storage module, after the interruption of a resistor, decreases, since the current from the operating voltage source VCP, which can be switched to different potentials, passes over to the operating voltage connected to the collectors of the read transistors.

In a working embodiment of the invention, the following values were utilized and/or obtained.

VB = 1.29 V
VB1 = 1.0 V
VB2 = 3.7 V
VB3 = 1.05 V
VB4 = 1.3 V
VB5 = 1.7 V

The voltage on the column line during the interruption of a memory resistor was approximately −2.5 V. The read voltage on a column line was approximately −1.3 V, and the read current was approximately 2 mA. The current for interrupting a memory resistor was 20–30 mA.

Although we have described our invention by reference to a particular illustrative embodiment thereof, many changes and modifications of the invention may become apparent to those skilled in the art without departing from the spirit and scope of the invention. We therefore intend to include within the patent warranted hereon all such changes and modifications as may reasonably and properly be included within the scope of our contribution to the art.

We claim:

1. In a programmable read only memory of the type in which a storage cell is located at the intersections of column lines and row lines and each storage cell includes a circuit element and a resistance which is interrupted in response to a predetermined current therethrough, which current is large with respect to a reading current through the resistance, and in which the storage cells are selected for writing by the application of signals to the appertaining row and column lines, the improvement therein comprising:
   a regulating transistor connected to each respective column line, said transistor having an emitter connected to the respective column line, a collector connected to a first reference potential, and a base connected to a second reference potential having a value selected to activate said transistor only if the voltage on the column line falls below a predetermined value during an interruption operation.

2. In the improved memory of claim 1, wherein each of said circuit elements is a storage transistor having a base connected to a row line, a collector connected to an operating potential and an emitter connected to the row line via and resistance, and comprising means causing said second reference potential to be more positive than or equal to the potential on non-selected row lines.

3. In the improved memory of claim 1, comprising a read amplifier connected to a respective column line and a reading transistor including a base, an emitter and a collector with the collector-emitter path connected between the column line and said reading amplifier and said base connected to a third reference potential, said second reference potential, said second reference potential being greater than said third reference during the programming of information.

* * * * *